United States Patent
Yen et al.

(10) Patent No.: US 9,136,014 B2
(45) Date of Patent: Sep. 15, 2015

(54) METHOD FOR REPLACING THE ADDRESS OF SOME BAD BYTES OF THE DATA AREA AND THE SPARE AREA TO GOOD ADDRESS OF BYTES IN NON-VOLATILE STORAGE SYSTEM

(71) Applicant: Storart Technology Co., Ltd., Hsinchu (TW)

(72) Inventors: Chih-Nan Yen, Hsinchu (TW); Chien-Cheng Lin, Hsinchu (TW)

(73) Assignee: Storart Technology Co. Ltd., Hsinchu (TW)

( * ) Notice: Subject to any disclaimer, the term of this patent is extended or adjusted under 35 U.S.C. 154(b) by 0 days.

(21) Appl. No.: 14/139,754

(22) Filed: Dec. 23, 2013

(65) Prior Publication Data
US 2015/0179279 A1    Jun. 25, 2015

(51) Int. Cl.
*G11C 7/00*     (2006.01)
*G11C 29/00*    (2006.01)

(52) U.S. Cl.
CPC ...................................... *G11C 29/00* (2013.01)

(58) Field of Classification Search
CPC ....................................................... G11C 29/00
USPC ..................................... 365/200, 230.04, 239
See application file for complete search history.

(56) References Cited

U.S. PATENT DOCUMENTS

| | | | | |
|---|---|---|---|---|
| 4,682,292 A * | 7/1987 | Bue et al. | ..................... | 701/33.4 |
| 5,867,435 A * | 2/1999 | Ogino | ........................... | 365/200 |
| 5,910,921 A * | 6/1999 | Beffa et al. | .................... | 365/201 |
| 6,212,647 B1 * | 4/2001 | Sims et al. | ................... | 714/6.13 |
| 6,571,353 B1 * | 5/2003 | Sato | ............................ | 714/6.32 |
| 6,928,377 B2 * | 8/2005 | Eustis et al. | .................. | 702/118 |
| 6,950,352 B1 * | 9/2005 | Jung et al. | .................... | 365/200 |
| 7,930,592 B2 * | 4/2011 | Ouellette et al. | ............... | 714/30 |
| 8,413,013 B2 * | 4/2013 | Toda | ............................. | 714/763 |
| 8,769,356 B2 * | 7/2014 | Yu et al. | ........................ | 714/719 |

* cited by examiner

*Primary Examiner* — Viet Q Nguyen
(74) *Attorney, Agent, or Firm* — Che-Yang Chen; Law Office of Michael Chen (57) ABSTRACT

A method for replacing the address of some bad bytes (bad columns) of the data area and the spare area to the good address of bytes (good columns) in non-volatile storage system is disclosed. The steps of the method are: waiting for a command from a host; judging if there is still some data to be processed; if no, go back to the previous step; if yes, go to next step; judging if a bad column is used; if no, process data access and go back to the step of judging if there is still some data to be processed; and if yes, process data accessing as original operation and increase the address by one.

2 Claims, 9 Drawing Sheets

| Bad Column | Replaced Column |
|---|---|
| B1 | S1 |
| B2 | S2 |
| ... | ... |
| Bn | Sn |

| Bad Column |
|---|
| B1 |
| B2 |
| ... |
| Bn |

METHOD FOR REPLACING THE ADDRESS OF SOME BAD BYTES OF THE DATA AREA AND THE SPARE AREA TO GOOD ADDRESS OF BYTES IN NON-VOLATILE STORAGE SYSTEM

FIELD OF THE INVENTION

The present invention relates to a method for replacing the address of some bad bytes (bad columns) of the data area and the spare area to the good address of bytes (good columns) in non-volatile storage system.

BACKGROUND OF THE INVENTION

Since a storage system may have bad bytes in the data area and spare area at the time of shipment, these bad bytes must be replaced by good bytes These bad bytes would be denoted as "Bad Columns"

Figure 1:
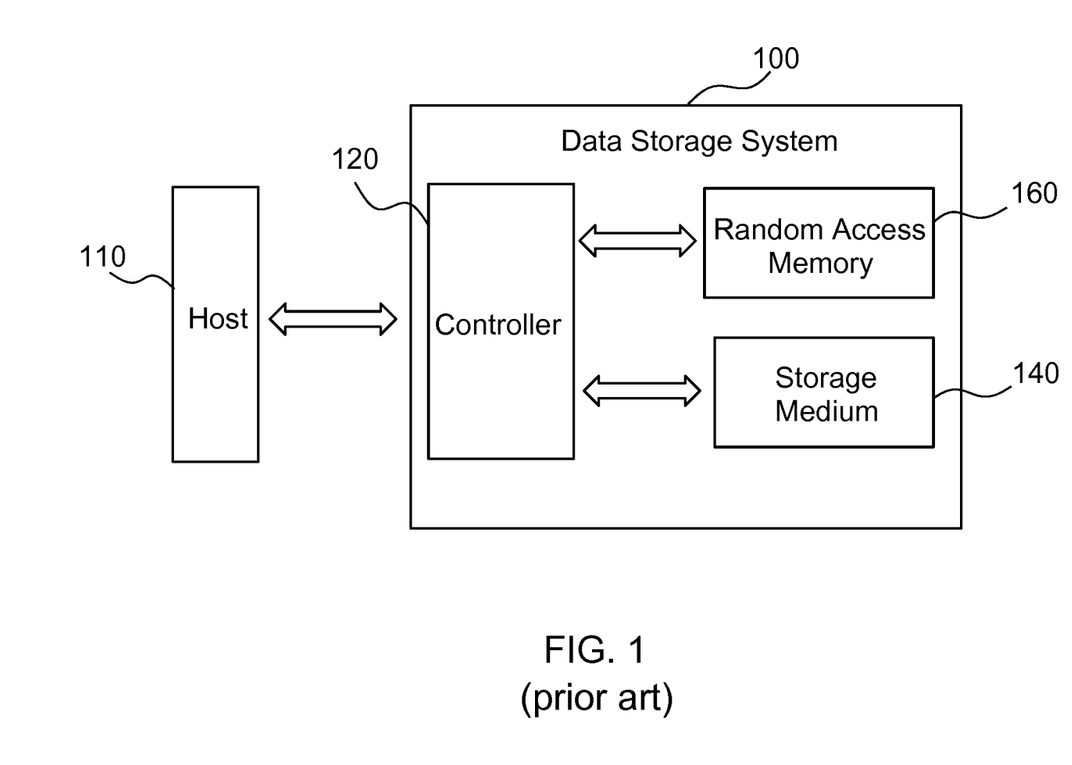
FIG. 1 is a block diagram of a conventional data storage system.

Please reference to FIG. 1, which illustrates a non-volatile storage system, such as a memory card, solid state disk, pen-drive, and so on, used to store data from hosts Generally, a non-volatile data storage system 100 comprises a controller 120, a non-volatile storage medium 140 and a random access memory 160. The controller 120 is as an interface located between the host 110 and the storage medium 140. The controller 120 converts a logical address to a physical address according to a logical-to-physical address mapping table (not shown). The non-volatile storage medium 140 is for data storage and may be a hard disk or a flash memory. The random access memory 160 may is a volatile memory, which stores temporary data or information for controller operation.

Figure 2:
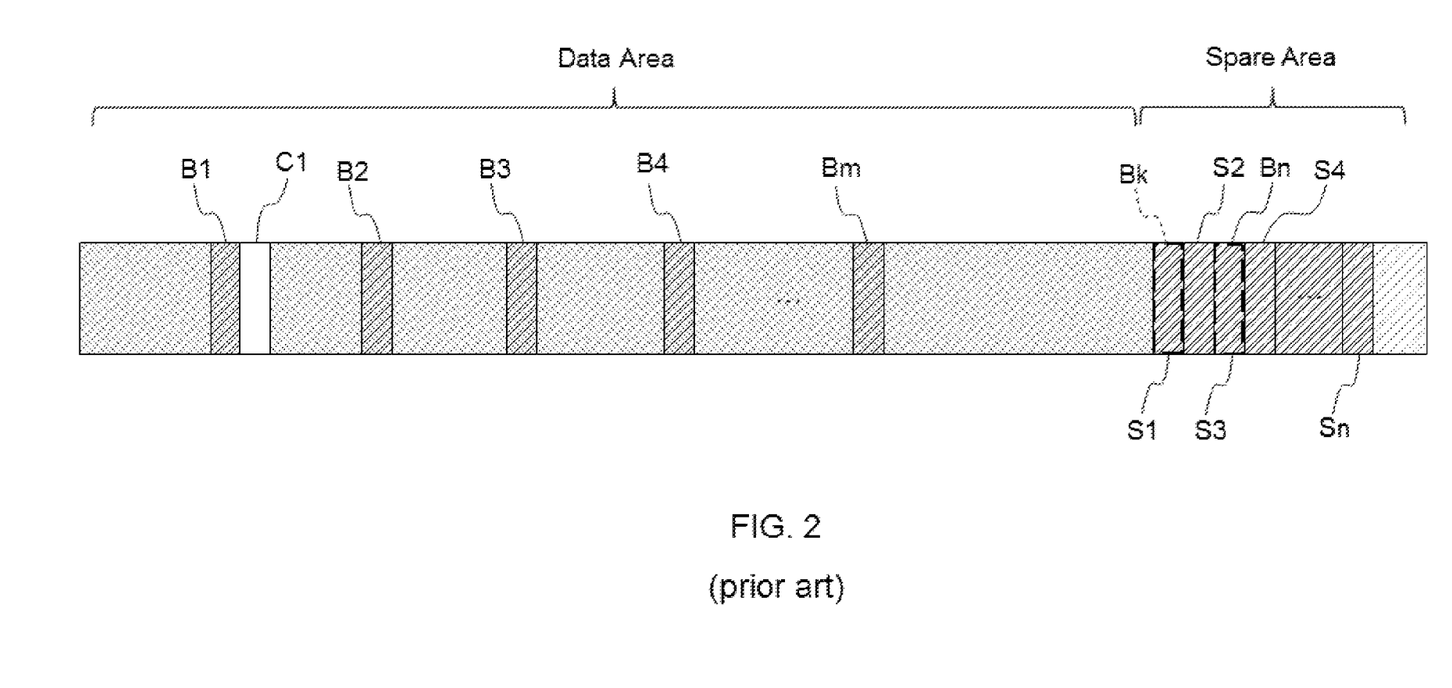
FIG. 2 is a schematic diagram of the conventional method for replacing the address of some bad bytes (bad columns) of the data area and the spare area to the good address of bytes (good columns).
Figure 3:
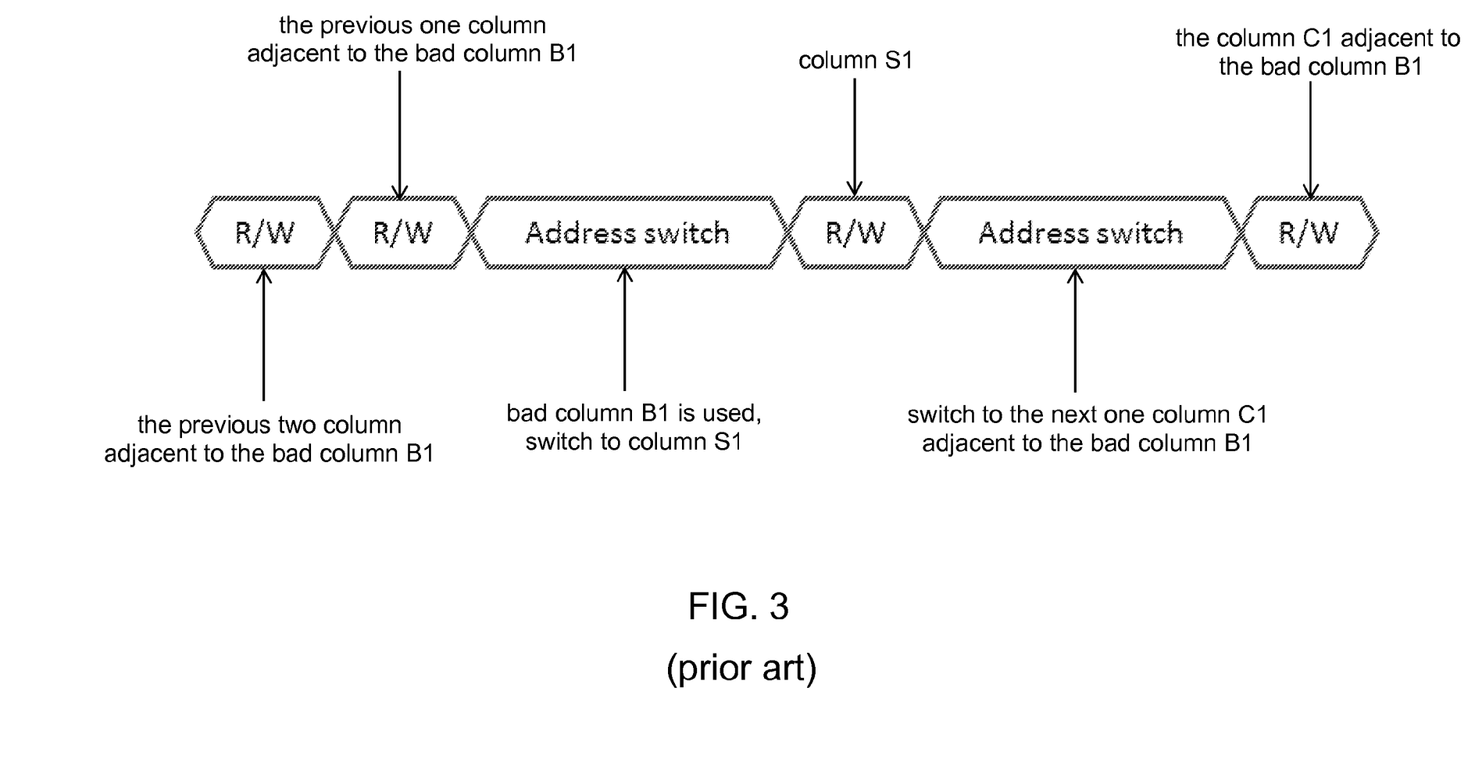
FIG. 3 is a schematic diagram of the conventional method for replacing the address of some bad bytes (bad columns) of the data area and the spare area to the good address of bytes (good columns) in data stream.
Figure 4:
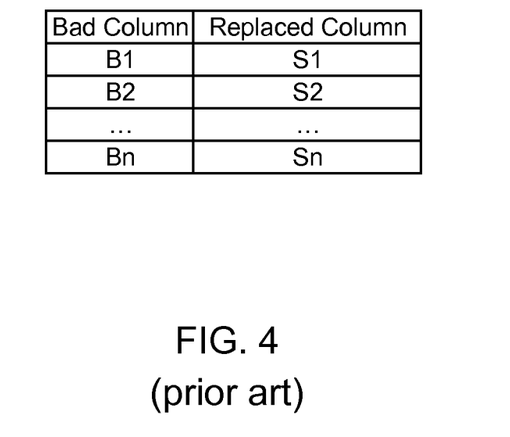
FIG. 4 is a mapping table used for the method in FIG. 2.

Please also reference to FIGS. 2 to 4. FIG. 2 is a schematic diagram of the conventional method for replacing bad column. FIG. 3 is a schematic diagram of the conventional method for replacing bad column in data stream. FIG. 4 is a mapping table used for the method in FIG. 2.

In FIG. 2, B1, B2 ... Bn are referred to bad columns, which may be replaced by good spare columns S1, S2 ... Sn, respectively. The mapping table is shown in FIG. 4.

In FIG. 3, Bad column Bn is used when accessing data, then the controller 120 (shown in FIG. 1) has to switch the column address of the bad column B1 to the spare column S1 and perform access, and then switch back to the column address of the column C1 next to the bad column B1 to continue original access. If the spare column S1 is just also a bad column, more complex operations may be involved. For a storage system with n bad columns, a table with 2n entries is required for bad column mapping (shown in FIG. 4).

Figure 5:
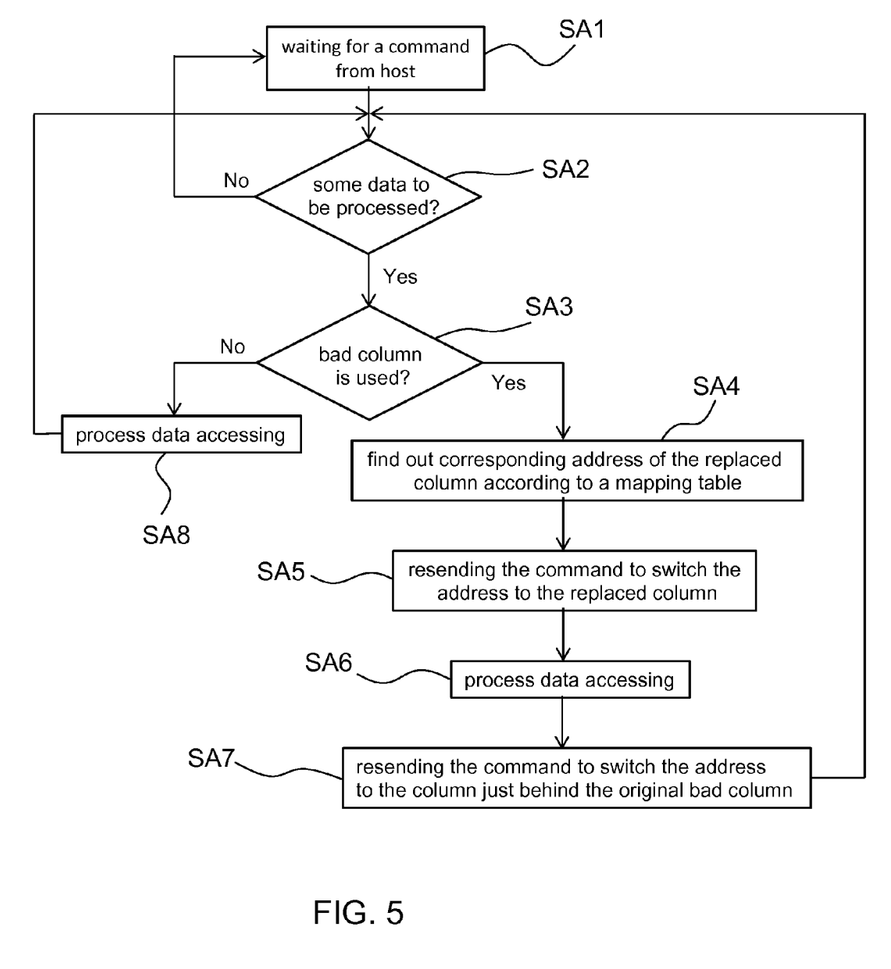
FIG. 5 is a flow chart of the conventional method for replacing the address of some bad bytes (bad columns) of the data area and the spare area to the good address of bytes (good columns).

Please reference to FIG. 5, which is a flow chart of the conventional method for replacing the address of some bad bytes (bad columns) of the data area and the spare area to the good address of bytes (good columns).

The conventional method for replacing the address of some bad bytes (bad columns) of the data area and the spare area to the good address of bytes (good columns) comprises the steps as following:

step SA1: waiting for a command from the host (110 shown in FIG. 1);
step SA2: judging if there is still some data to be processed; if no, go back to the step SA1; if yes, go to next step;
step SA3: judging if a bad column is used; if no, process data access and go back to the step SA2 (step SA8);
step SA4: if yes, find out corresponding address of the replaced column according to a mapping table;
step SA5: switch the address to the replaced column;
step SA6: processing data accessing; and
step SA7: switch the address to the column just behind the original bad column and go back to the step SA2.

The conventional bad column replacement methodology has following disadvantages.
1. Need larger table for bad column mapping.
2. Data access is not continuous and then results in complex operations and with high cost of software and hardware.
3. Data access is not continuous and then results in performance degrade.

That is, the conventional bad column replacement methodology is poor performance, complex operation, and with high cost of software and hardware.

SUMMARY OF THE INVENTION

A method for replacing the address of some bad bytes (bad columns) of the data area and the spare area to the good address of bytes (good columns) in non-volatile storage system is provided to solve discontinuous access while bad column replacement is involved in non-volatile storage system. The method is capable of making data access continuous, and then improving performance. The method is also capable of making access operations simpler, and then reducing cost of software and hardware.

A method for replacing the address of some bad bytes (bad columns) of the data area and the spare area to the good address of bytes (good columns) in non-volatile storage system is provided and the steps of the method comprises:

step SB1: waiting for a command from a host;
step SB2: judging if there is still some data to be processed; if no, go back to the step SB1; if yes, go to next step;
step SB3: judging if a bad column is used; if no, process data access (step SB5) and go back to the step SB2; and
step SB4: if yes, process data accessing as original operation and increase the address to the next data access unit (1-byte, 2-byte or 4-byte, etc.) and then go back to the step SB2.

DESCRIPTION OF THE PREFERRED EMBODIMENT

Figure 6:
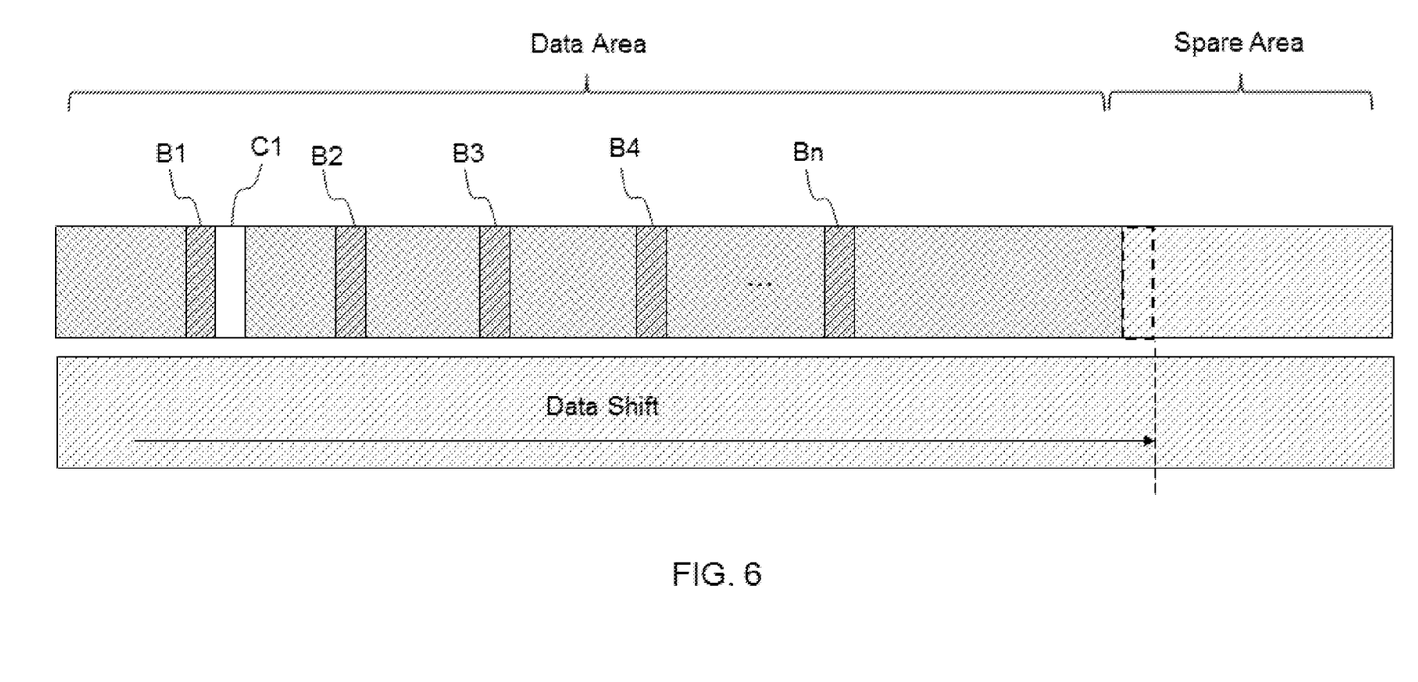
FIG. 6 is a schematic diagram of the method for replacing the address of some bad bytes (bad columns) of the data area and the spare area to the good address of bytes (good columns) in non-volatile storage system in accordance with this invention.
Figure 7:
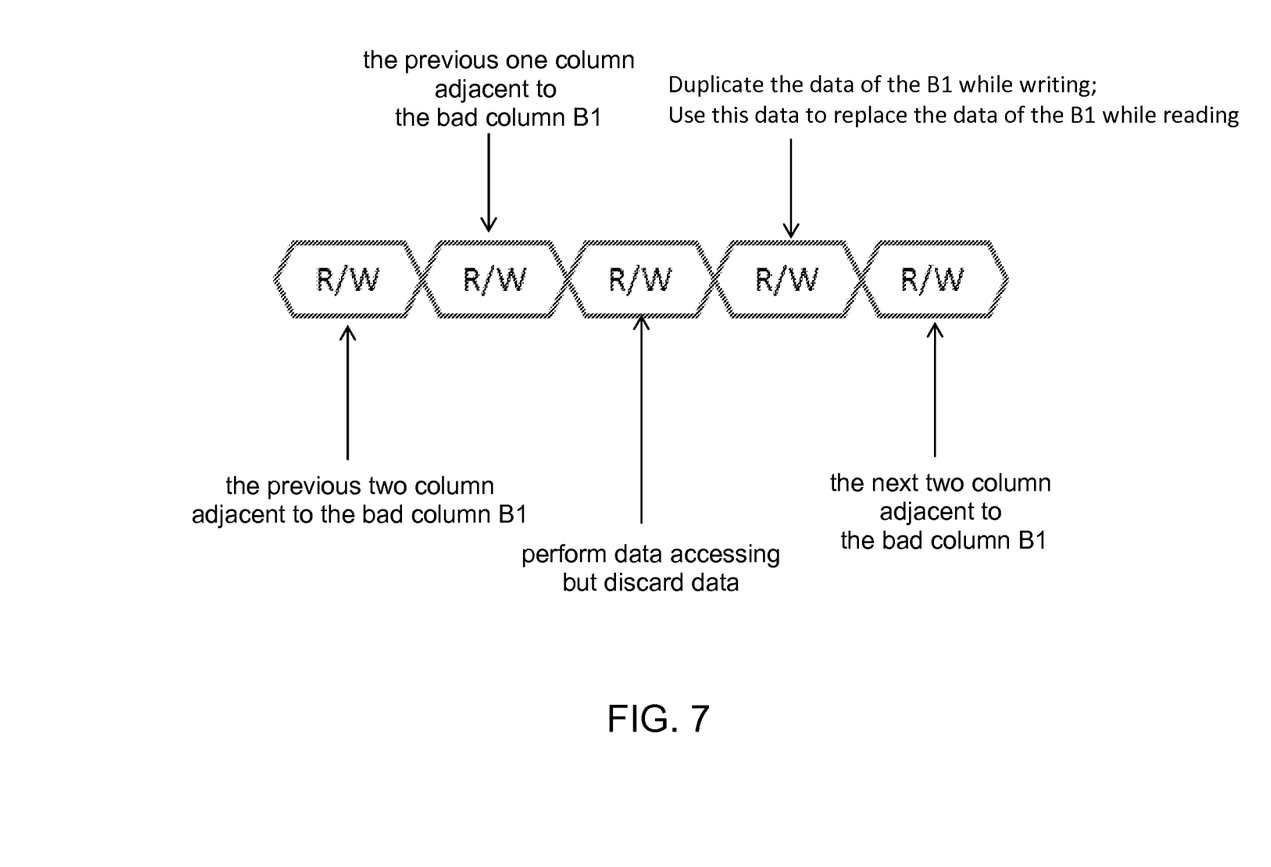
FIG. 7 is a schematic diagram of the method for replacing the address of some bad bytes (bad columns) of the data area and the spare area to the good address of bytes (good columns) in data stream in non-volatile storage system in accordance with this invention.

FIG. 6 is a schematic diagram of a method for replacing the address of some bad bytes (bad columns) of the data area and the spare area to the good address of bytes (good columns) in non-volatile storage system in accordance with this invention. FIG. 7 is a schematic diagram of the method for replacing the address of some bad bytes (bad columns) of the data area and the spare area to the good address of bytes (good columns) in data stream in non-volatile storage system in accordance with this invention.

Please reference to FIG. 6, the reference symbols B1, B2 . . . and Bn are referred to bad columns. Please also reference to FIG. 7, when the bad column B1 is used for accessing data, the controller 120 (shown in FIG. 1) may bypass data of the bad column B1 and use data of the column C1 next to the bad column B1 to replace the data of the bad column B1. It means that the data of the column C1 later than the bad column B1 may be shifted right by one column address.

Simultaneously, the data of the column C2 later than the bad column B2 may be shifted right by one column address again; it means they may be shifted right by two column addresses totally. That is, the data of the column Cn later than the bad column Bn may be shifted right by n column addresses totally.

In FIG. 7, the controller 120 (shown in FIG. 1) may perform data access sequentially, just like no bad columns. It merely has to discard the data of bad columns and do not need to change operation, compared to the address switch of the conventional methodology.

Figure 8:
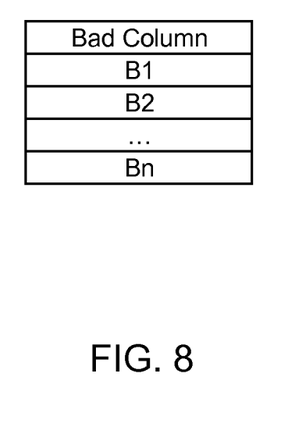
FIG. 8 is a mapping table used for the method in FIG. 6.

Please refer to FIG. 8, for a storage system with n bad columns, a table with n entries is enough since only bad column information is necessary, but no mapping information is required.

Figure 9:
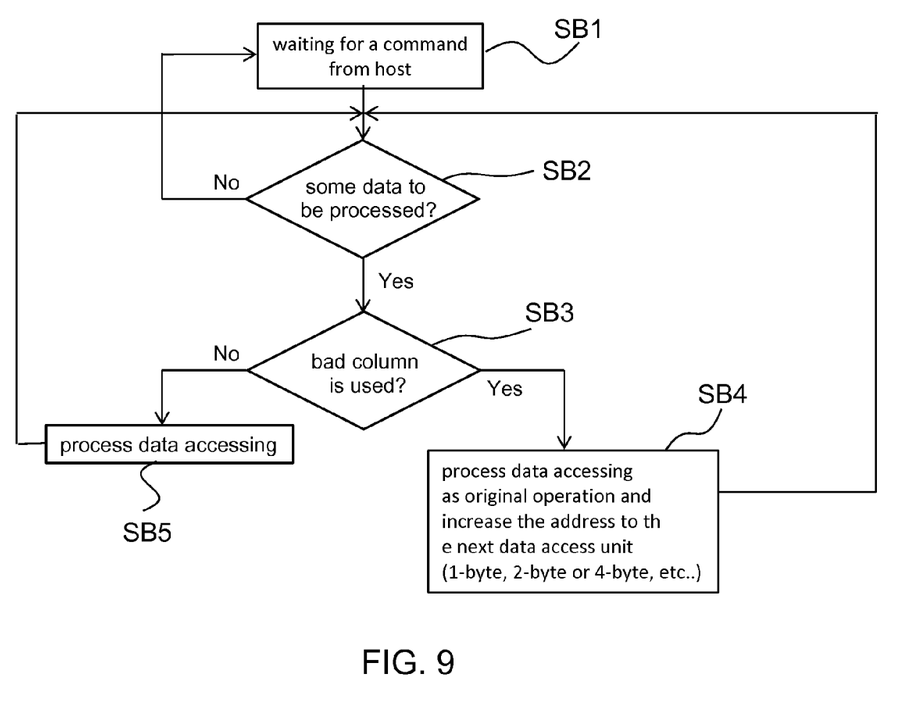
FIG. 9 is a flow chart of the method for replacing the address of some bad bytes (bad columns) of the data area and the spare area to the good address of bytes (good columns) in non-volatile storage system in accordance with this invention.

FIG. 9 is a flow chart of the method for replacing bad column in non-volatile storage system in accordance with this invention.

Please refer to FIG. 9, the method for replacing the address of some bad bytes (bad columns) of the data area and the spare area to the good address of bytes (good columns) in non-volatile storage system of this invention comprises the steps as following:

step SB1: waiting for a command from a host;
step SB2: judging if there is still some data to be processed; if no, go back to the step SB1; if yes, go to next step;
step SB3: judging if a bad column is used; if no, process data access (step SB5) and go back to the step SB2; and
step SB4: if yes, process data accessing as original operation and increase the address to the next data access unit (1-byte, 2-byte or 4-byte, etc.) and then go back to the step S132.

Or the controller 120 (shown in FIG. 1) may just omit the access in bad columns which depends on the design. This method with address switch-less operation may improve the performance dramatically as the number of bad columns increase, and simply the access operations and then reduce the cost of software and hardware.

What is claimed is:

1. A method for replacing the address of a bad column with the address of a good column in a non-volatile storage system, comprising the steps of:
   receiving an access command of a data stored in the non-volatile storage system from a host;
   determining whether the data is stored in the bad column (Bn), where n is an integer;
   duplicating the data stored in the bad column (Bn) to the good column (Cn) which is adjacent to the bad column (Bn); and
   accessing the good column (Cn) if the data is determined to be stored in the bad column (Bn),
   wherein address of the data is shifted by n columns while the non-volatile storage system includes an amount of n bad columns before the good column (Cn).

2. The method according to claim 1, wherein increasing the address to the next column by a predetermined amount of byte(s) which is equal to or larger than 1 byte.

\* \* \* \* \*